United States Patent
Frame et al.

(10) Patent No.: US 6,944,708 B2
(45) Date of Patent: Sep. 13, 2005

(54) METHOD OF SELF-REFRESH IN LARGE MEMORY ARRAYS

(75) Inventors: David W. Frame, Phoenix, AZ (US); Edward Butler, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/104,544

(22) Filed: Mar. 22, 2002

(65) Prior Publication Data

US 2003/0182493 A1 Sep. 25, 2003

(51) Int. Cl.$^7$ ................................................. G06F 12/00
(52) U.S. Cl. ...................................... 711/106; 365/222
(58) Field of Search ...................... 711/106, 5; 365/200, 365/222, 230.03

(56) References Cited

U.S. PATENT DOCUMENTS

| | | | | |
|---|---|---|---|---|
| 5,966,725 A | * | 10/1999 | Tabo | 711/106 |
| 6,381,188 B1 | * | 4/2002 | Choi et al. | 365/222 |
| 6,507,532 B1 | * | 1/2003 | Fujino et al. | 365/230.03 |
| 6,650,587 B2 | * | 11/2003 | Derner et al. | 365/222 |
| 6,678,195 B2 | * | 1/2004 | Hidaka | 365/200 |
| 6,697,909 B1 | * | 2/2004 | Wang et al. | 711/106 |

* cited by examiner

*Primary Examiner*—Nasser Moazzami
(74) *Attorney, Agent, or Firm*—Kacvinsky LLC

(57) ABSTRACT

A method of self-refresh in a memory array includes initializing a programmable refresh counter of a memory module to an offset value from at least another memory module in the memory array. A data line carrying a system-wide self-refresh indicator signal is interrogated to determine whether any memory module is in a self-refresh mode. The self-refresh mode for the memory module is entered if the programmable refresh counter indicates that a self-refresh cycle is due, and it is determined that no other memory modules are in the self-refresh mode.

30 Claims, 3 Drawing Sheets

METHOD OF SELF-REFRESH IN LARGE MEMORY ARRAYS

BACKGROUND OF THE INVENTION

1. Field of the Invention

The present invention relates to a memory array having a plurality of memory modules. More particularly, the present invention relates to a system and method of self-refresh for memory modules within a memory array to facilitate suspend states in computer systems (e.g., servers, routers, etc.), which result in power savings, while still being capable of supporting large memory structures.

2. Discussion of the Related Art

Server systems that support large memory structures utilize a significant amount of power during normal usage. Server systems may undergo periods of low usage. However, there has not been much focus on incorporating suspend or sleep states in server systems during low usage. Incorporating suspend or sleep states in server systems would provide significant power savings, especially in large server farms.

Computer systems that implement large amounts of random access memory (RAM) have power issues with implementing sleep or suspend states. These power issues stem from the current draw associated with a self-refresh cycle on the dynamic random access memory (DRAM) that is utilized. For example, when the DRAM is in an Advanced Configuration and Power Interface (ACPI) S3 state (suspend-to-RAM) (the Advanced Configuration and Power Interface (ACPI) Specification, Revision 2.0, Jul. 27, 2000, co-developed by Compaq, Intel, Microsoft, Phoenix, and Toshiba), it generates a refresh cycle based on asynchronous internal clocks. When this refresh is engaged, the power current jumps by approximately 492 mA. When considering a worst-case scenario of all of the dual-inline memory modules (DIMMs) having the DRAM components refreshing at once (in the S3 state, there are no global clocks present, all timers are based on internal asynchronous clocks), the system provides 530 mA per DIMM slot, or 4.24A in an eight (8) DIMM memory array. Such amount of required current is a significant barrier to supporting suspend or sleep states, such as a S3 state, in the computer system.

Accordingly, there is a need for a computer system implementation that is capable of conserving power during low usage periods.

DETAILED DESCRIPTION

Figure 1:
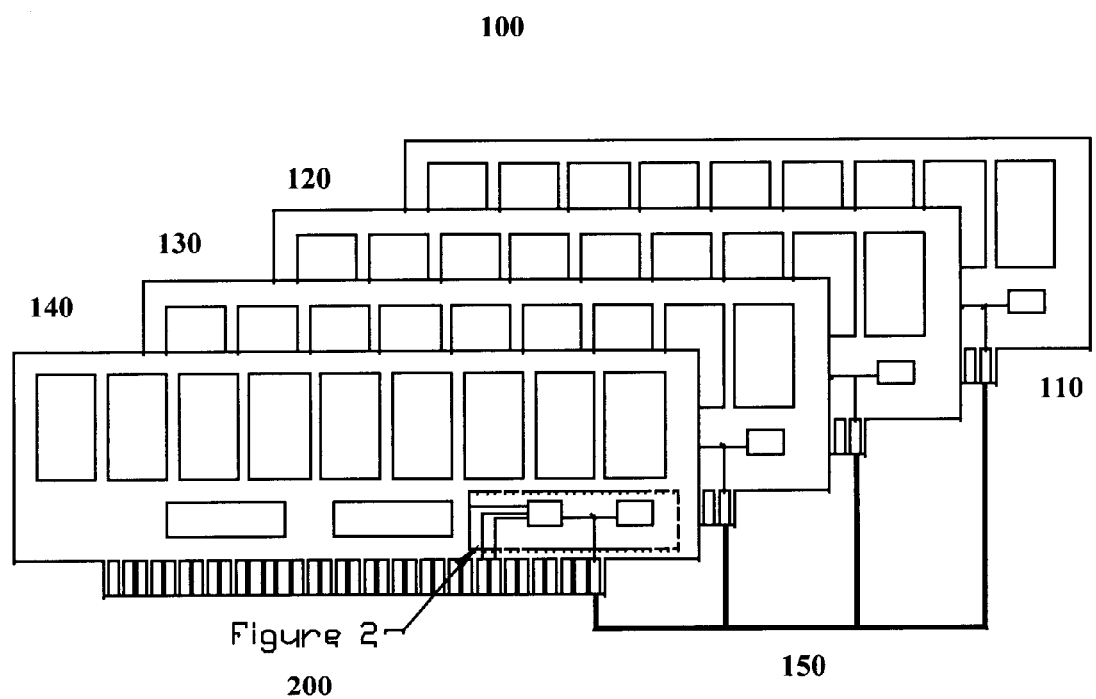
FIG. 1 illustrates a memory array according to an embodiment of the present invention.

FIG. 1 illustrates a memory array according to an embodiment of the present invention. In order to provide for a system implementation where a sleep or suspend mode may be utilized during low usage, the present invention prevents multiple dual-inline memory modules (DIMMs) in the system from simultaneously entering a self-refresh mode. The memory array 100 illustrated in FIG. 1 includes four (4) DIMMs 110, 120, 130, 140, each having multiple memory (DRAM) components. The DRAM components include a programmable refresh counter for the memory module 110, 120, 130, 140 on which they reside. Each of the DIMMs 110, 120, 130, 140 are in electrical communication with each other via at least one connection 150, such as a serial data line (SDA line), to be discussed further below. Each DIMM 110, 120, 130, 140 also includes a logic circuit 200. Although four (4) DIMMs 110, 120, 130, 140 are illustrated in the example of FIG. 1, any number of memory modules may be utilized according to the present invention.

Figure 2:
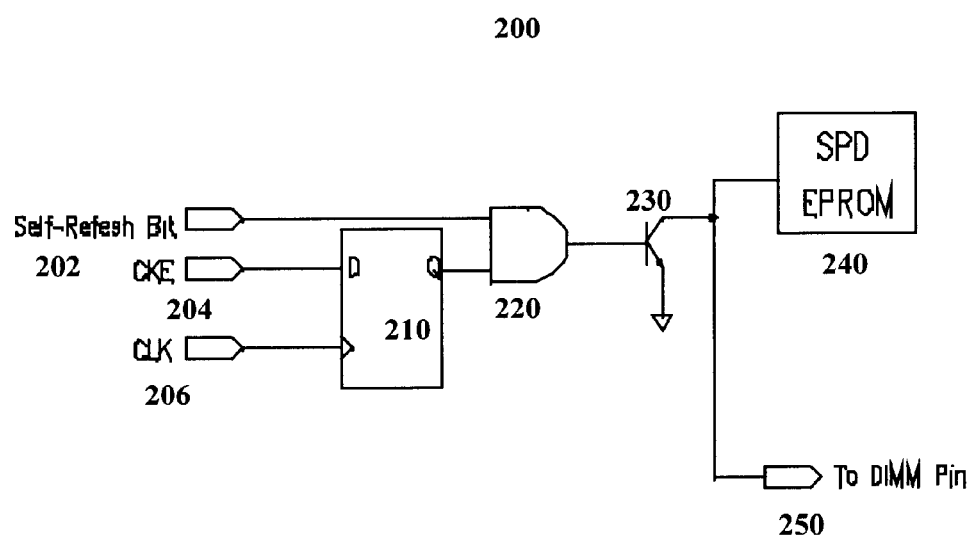
FIG. 2 illustrates a logic circuit for a memory module according to an embodiment of the present invention.

FIG. 2 illustrates a logic circuit for a memory module according to an embodiment of the present invention. The logic circuit 200 of each DIMM 110, 120, 130, 140 prevents the DIMMs 110, 120, 130, 140 from simultaneously entering a self-refresh mode while the system is in a low power or sleep mode, such as the ACPI S3 suspend-to-RAM state. The logic circuit 200 includes a D-latch 210 that receives a "clock enable" signal (CKE) 204 and a clock signal (CLK) 206. The D-latch 210 is used to capture, or "latch" the logic level that is present on the data line (D) (the clock enable signal (CKE) 204) when the clock input (CLK) 206 transitions high. For example, the state of the D-line is transferred to the output, Q, upon the transition, e.g., from low to high, of the clock signal (CLK) 206. The clock enable signal (CKE) 204 is in a low state if the system is not in a sleep state. Accordingly, the D-latch 210 generates an output latch signal based on the clock enable signal (CKE) 204 and the clock signal (CLK) 206.

The logic circuit 200 also includes a logical AND gate 220 that receives a self-refresh bit signal 202 (indicating whether the memory module is to undergo self-refresh) and the output latch signal from the D-latch 210. Based on the self-refresh bit signal 202 and the output latch signal from the D-latch 210, the logical AND gate 220 provides an output signal to a "pull down" transistor or driver/buffer circuit 230. The transistor 230 illustrated in FIG. 2 is an "open collector" type, which enables multiple transistors 230 from the different DIMMs 110, 120, 130, 140 to be connected to the same line (e.g., SDA line 150) without interference from each other. However, any suitable transistor or driver circuit may be utilized. The transistor 230 receives the output signal, and in turn, provides a system-wide self-refresh indicator signal based on the output signal received from the logical AND gate 220. Although FIG. 2 illustrates one specific embodiment of a logic circuit, other circuitry configurations may be utilized for a logic circuit that provides a system-wide self-refresh indicator signal utilizing based received signals as in the logic circuit 200 of FIG. 2.

In one embodiment of the present invention, the system-wide self-refresh indicator signal is transmitted along the same data line as the one utilized by a serial presence detect (SPD) device 240 of the memory module 110, 120, 130, 140. The SPD device 240 is illustratively an electrically-erasable programmable read-only memory (EEPROM) device on a synchronous dynamic random access memory (SDRAM) module. The information stored on the SPD device 240 provides the basic input/output system (BIOS) with the module's size, speed, data width, and voltage. The data line connects to a pin 250 on the memory module 110, 120, 130, 140. According to one embodiment of the present invention, the pin 250 is connected to a serial data line (SDA line) 150 that is in electric communication with each one of the plurality of memory modules 110, 120, 130, 140 in the memory array 100 (see FIG. 1). Although the system-wide self refresh indicator signal need not be carried on the SDA line 150 and may be carried on another data line, the SDA line 150 is useful when implementing a S3 suspend-to-RAM state because the SDA line 150 is not utilized by the SDA device 240 during the S3 state.

The system-wide self-refresh indicator signal carried on the SDA line 150 alerts each memory module 110, 120, 130, 140 of whether a memory module is undergoing a self-refresh cycle. In one embodiment, if the system-wide self-refresh indicator signal on the SDA line 150 is in a high state, then, none of the memory modules 110, 120, 130, 140 are in a self-refresh mode. If the system-wide self-refresh indicator signal on the SDA line 150 is in a low state, then one of the memory modules 110, 120, 130, 140 is undergoing self-refresh. As illustrated in FIG. 1, all of the DIMMs 110, 120, 130, 0.140 share the SDA line 150, and therefore, each of the DIMMs 110, 120, 130, 140 is aware of when any one of the DIMMs 110, 120, 130, 140 is in a self-refresh mode by monitoring the SDA line 150.

Figure 3:
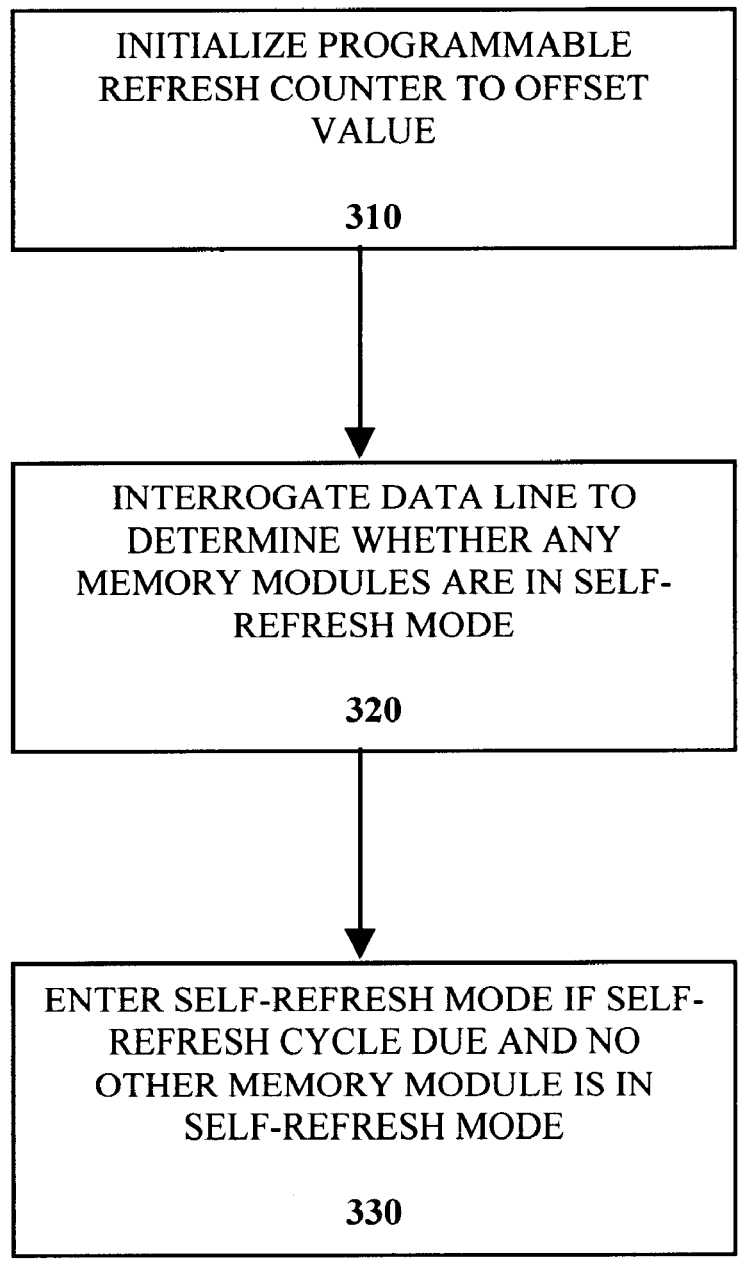
FIG. 3 illustrates a flow chart diagram of implementing self-refresh of a memory module in a memory array according to an embodiment of the present invention.

FIG. 3 illustrates a flow chart diagram of implementing self-refresh of a memory module in a memory array according to an embodiment of the present invention. The present invention prevents multiple DIMMs 110, 120, 130, 140 from simultaneously entering a self-refresh mode while in a low power or sleep state. To that end, prior to entering a low power or sleep state, each memory module's DRAM programmable refresh counter is initialized 310, by, for example, a memory controller (not illustrated), to an offset value from each other memory module 110, 120, 130, 140 in the memory array 100. The offset value distributes each memory module's 110, 120, 130, 140 mandatory refresh start point. For example, with the four (4) DIMM 110, 120, 130, 140 configuration as illustrated in FIG. 1, each of which having a 32 millisecond (ms) retention time, their refresh counters are initialized at 4 ms, 8 ms, 16 ms, and 24 ms, respectively. After initialization, each DIMM 110, 120, 130, 140 enters a refresh cycle after the elapsed offset time, e.g., at 4 ms, 8 ms, etc. Each DIMM 110, 120, 130, 140 enters a mandatory refresh cycle every 32 ms plus the offset time, i.e., at 36 ms, 40 ms, etc., which provides a level of assurance that no more than one DIMM enters a self-refresh cycle at the same time. The timing values discussed above are merely illustrative, and memory modules and memory components having different timing parameters may also be utilized with the present invention.

Moreover, for added security, each DIMM 110, 120, 130, 140 interrogates 320 (or detects, by the logic circuit 200, for example, or a different logic circuit) the SDA line 150, or any other data line carrying the system-wide self-refresh indicator signal (or the output signal from the AND gate 220), to determine whether any of the DIMMs 110, 120, 130, 1.40 are in fact in a self-refresh mode. Accordingly, a DIMM 110, 120, 130, 140 enters 330 a self-refresh mode only if it determines that no other DIMM in the memory array 100 is in a self-refresh mode. According to an embodiment of the present invention, a DIMM enters a self-refresh mode only if it determines that the SDA line 150 carrying the system-wide self-refresh indicator signal is in a high state. And, as a DIMM enters the self-refresh mode, the DIMM pulls down the SDA line 150 carrying the system-wide self-refresh indicator signal to a low state, alerting all of the other DIMMs in the memory array 100 that it is in a self-refresh mode. This configuration interlocks the system from having more than one DIMM being in a self-refresh mode at the same time.

Accordingly, by utilizing the system and method of the present invention, the current requirement for a system having an eight (8) DIMM memory array is reduced to about 800 mA (which is within the requirements of supporting the ACPI S3 state), as compared to 4.24A, as mentioned above, if all of the eight (8) DIMMs initiated self-refresh at the same time. By facilitating a S3 suspend-to-RAM state in computer systems, significant power savings may be accomplished, while still supporting large memory structures. Therefore, during periods of low usage, front-end servers may be selectively placed into sleep state, providing for significant energy savings in large server farms. Although server systems have been described herein as one example of a particular implementation of the present invention, the present invention is applicable to any system having large memory arrays that can benefit from reduced power consumption. Moreover, the present invention is not solely limited to utilizing the ACPI S3 state, but any suitable power savings standard or protocol may be utilized.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A method of self-refresh in a memory array, comprising:

initializing a programmable refresh counter of a memory module to an offset value from at least another memory module in the memory array;

interrogating a data line carrying a system-wide self-refresh indicator signal to determine whether any memory module is in a self-refresh mode; and entering the self-refresh mode for the memory module if the programmable refresh counter indicates that a self-refresh cycle is due, and it is determined that no other memory modules are in the self-refresh mode, such that only one memory module at a time enters a self-refresh mode.

2. The method according to claim 1, wherein the memory module is a dual-inline memory module (DIMM).

3. The method according to claim 1, wherein the memory module includes a dynamic random access memory (DRAM) component.

4. The method according to claim 1, wherein a low state of the system-wide self-refresh indicator signal indicates that the memory module has entered the self-refresh mode.

5. The method according to claim 1, wherein a high state of the system-wide self-refresh indicator signal indicates that the memory module has not entered the self-refresh mode.

6. The method according to claim 1, wherein the self-refresh mode is entered during an Advanced Configuration and Power Interface (ACPI) S3 state.

7. A program code storage device, comprising: a machine-readable storage medium; and machine-readable program code, stored on the machine-readable storage medium, having instructions to initialize a programmable refresh counter of a memory module to an offset value from at least another memory module in a memory array, interrogate a data line carrying a system-wide self-refresh indicator signal to determine whether any memory module is in a self-refresh mode, and enter the self-refresh mode for the memory module if the programmable refresh counter indicates that a self-refresh cycle is due, and if it is determined that no other memory modules are in the self-refresh mode.

8. The program code storage device according to claim 7, wherein the memory module is a dual-inline memory module (DIMM).

9. The program code storage device according to claim 7, wherein the memory module includes a dynamic random access memory (DRAM) component.

10. The program code storage device according to claim 7, wherein a low state of the system-wide self-refresh indicator signal indicates that the memory module has entered the self-refresh mode.

11. The program code storage device according to claim 7, wherein a high state of the system-wide self-refresh indicator signal indicates that the memory module has not entered the self-refresh mode.

12. The program code storage device according to claim 7, wherein the self-refresh mode is entered during an Advanced Configuration and Power Interface (ACPI) S3 state.

13. A memory module, comprising: a logic circuit, having a latch to receive an enable signal and a clock signal, and generate an output latch signal based on the enable signal and the clock signal, and a logic gate to receive a self-refresh bit signal and the output latch signal, and generate an output signal based on the self-refresh bit signal and the output latch signal; a programmable refresh counter to notify when the memory module should enter a self-refresh mode, wherein the programmable refresh counter is initialized to an offset value from at least one other memory module; and a second logic circuit to detect the output signal from the logic gate, wherein only one memory module at a time enters the self-refresh mode, and the memory module enters the self-refresh mode based on the output signal detected and a notification from the programmable refresh counter.

14. The memory module according to claim 13, wherein the memory module is a dual-inline memory module (DIMM).

15. The memory module according to claim 13, wherein the logic circuit further includes a driver to receive the output signal to generate a system-wide self-refresh indicator signal based on the output signal, and the second logic circuit detects the system-wide self-refresh indicator signal.

16. The memory module according to claim 15, wherein the memory module interrogates a data line carrying the system-wide self-refresh indicator signal to determine whether any other memory modules are in the self-refresh mode prior to entering the self-refresh mode.

17. The memory module according to claim 15, wherein a state of the system-wide self-refresh indicator signal indicates that the memory module has entered the self-refresh mode.

18. The memory module according to claim 15, wherein a state of the system-wide self-refresh indicator signal indicates that the memory module has not entered the self-refresh mode.

19. A self-refresh indication logic circuit for a memory module having a memory component, comprising: a latch to receive an enable signal and a clock signal, and generate an output latch signal based on the enable signal and the clock signal; a logic gate to receive a self-refresh bit signal and the output latch signal, and generate an output signal based on the self-refresh bit signal and the output latch signal; and a driver to receive the output signal to generate a system-wide self-refresh indicator signal based on the output signal, wherein the memory component includes a programmable refresh counter, the programmable refresh counter being initiated to an offset value from at least one other memory module, and only one memory module at a time enters a self-refresh mode.

20. The self-refresh indication logic circuit according to claim 19, wherein the memory module is a dual-inline memory module (DIMM).

21. The self-refresh indication logic circuit according to claim 19, wherein the memory component is a dynamic random access memory (DRAM).

22. The self-refresh indication logic circuit according to claim 19, wherein the memory module interrogates a data line carrying the system-wide self-refresh indicator signal to determine whether any other memory modules are in the self-refresh mode prior to entering the self-refresh mode.

23. The self-refresh indication logic circuit according to claim 19, wherein a state of the system-wide self-refresh indicator signal indicates that the memory module has entered the self-refresh mode.

24. The self-refresh indication logic circuit according to claim 19, wherein a state of the system-wide self-refresh indicator signal indicates that the memory module has not entered the self-refresh mode.

25. A memory module of a plurality of memory modules in a memory array, comprising: a memory component; a programmable refresh counter, wherein the programmable refresh counter is initialized to an offset value; and a logic circuit to generate a system-wide self-refresh indicator signal indicating if the memory module enters a self-refresh mode, to interrogate a data line to determine whether any one of the plurality of memory modules is in the self-refresh mode, and to enter the self-refresh mode for the memory module if the programmable refresh counter indicates that a self-refresh cycle is due and if it is determined that none of the plurality of memory modules are in the self-refresh mode.

26. The memory module according to claim 25, wherein the memory module is a dual-inline memory module (DIMM).

27. The memory module according to claim 25, wherein the memory component is a dynamic random access memory (DRAM).

28. The memory module according to claim 25, wherein a low state of the system-wide self-refresh indicator signal indicates that the memory module has entered the self-refresh mode.

29. The memory module according to claim 25, wherein a high state of the system-wide self-refresh indicator signal indicates that the memory module has not entered the self-refresh mode.

30. The memory module according to claim 25, wherein the system-wide self-refresh indicator signal is transmitted on the data line.

* * * * *